(12) United States Patent
Kaigala et al.

(10) Patent No.: US 10,144,008 B2
(45) Date of Patent: Dec. 4, 2018

(54) VERTICAL MICROFLUIDIC PROBE HEAD WITH LARGE SCALE SURFACE PROCESSING APERTURES

(71) Applicant: International Business Machines Corporation, Armonk, NY (US)

(72) Inventors: Govind Kaigala, Rueschlikon (CH); Robert Lovchik, Schoenenberg (CH); David P. Taylor, Thalwil (CH); Ismael Zeaf, Lausanne (CH)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 144 days.

(21) Appl. No.: 15/138,250

(22) Filed: Apr. 26, 2016

(65) Prior Publication Data

US 2017/0304821 A1    Oct. 26, 2017

(51) Int. Cl.
    *B01L 3/00* (2006.01)
    *B01L 3/02* (2006.01)
    *B81B 1/00* (2006.01)

(52) U.S. Cl.
    CPC .......... *B01L 3/5027* (2013.01); *B01L 3/0255* (2013.01); *B81B 1/00* (2013.01); *B01L 2200/0605* (2013.01); *B01L 2300/0861* (2013.01); *B01L 2300/0887* (2013.01)

(58) Field of Classification Search
    CPC ................................................... B01L 3/5027
    See application file for complete search history.

(56) References Cited

U.S. PATENT DOCUMENTS

| | | | |
|---|---|---|---|
| 2013/0153071 A1* | 6/2013 | Noishiki | B01J 19/00 137/896 |
| 2013/0333761 A1* | 12/2013 | Delamarche | B01L 3/502707 137/1 |
| 2014/0090715 A1 | 4/2014 | Delamarche et al. | |
| 2015/0144059 A1 | 5/2015 | Duerig et al. | |

FOREIGN PATENT DOCUMENTS

| | | |
|---|---|---|
| CN | 103255052 A | 8/2013 |
| WO | 2010128483 A2 | 11/2010 |
| WO | 2012056369 A1 | 5/2012 |

OTHER PUBLICATIONS

G.V. Kaigala, et al., "A Vertical Microfluidic Probe", Langmuir, 2011, 27 (9), pp. 5686-5693, Abstract Only.

* cited by examiner

*Primary Examiner* — Krishnan S Menon
*Assistant Examiner* — Dwan A Gerido
(74) *Attorney, Agent, or Firm* — Cantor Colburn LLP; Daniel Morris

(57) ABSTRACT

One or more embodiments of the present invention are directed to a vertical microfluidic probe head, which comprises a middle layer of material and two outer layers. The middle layer comprises two opposite, main surfaces, which are, each, grooved up to a same edge surface that adjoins each of the main surfaces, so as to form two sets of n microchannel cavities, n≥1, on each of the opposite main surfaces. The middle layer is furthermore arranged between the two outer layers, which (at least partly) close the microchannel cavities grooved on the two main surfaces. This way, two sets of n microchannels are formed, which are, each, open on the edge surface, such that two opposite sets of n orifices are formed on the edge surface. Thus, the length of the apertures is not limited by the thickness of the middle layer.

18 Claims, 6 Drawing Sheets

US 10,144,008 B2

VERTICAL MICROFLUIDIC PROBE HEAD WITH LARGE SCALE SURFACE PROCESSING APERTURES

BACKGROUND

The invention relates in general to the field of microfluidics, and in particular to vertical microfluidic probe heads.

Microfluidics deals with the behavior, precise control and manipulation of small volumes of fluids that are typically constrained to micrometer-length scale channels and to volumes typically in the sub-milliliter range. Prominent features of microfluidics originate from the peculiar behavior that liquids exhibit at the micrometer length scale. Volumes well below one nanoliter can be handled and analyzed by fabricating structures with lateral dimensions in the micrometer range. Reactions that are limited at large scales (by diffusion of reactants) can be accelerated. Finally, parallel streams of liquids can possibly be accurately and reproducibility controlled, allowing for chemical reactions and gradients to be made at liquid/liquid and liquid/solid interfaces.

More specifically, typical volumes of fluids in microfluidics range from $10^{-15}$ L to $10^{-5}$ L and are transported, circulated or more generally moved via microchannels with a typical diameter of $10^{-7}$ m to $10^{-4}$ m. At the microscale, the behavior of fluids can differ from that at a larger, e.g., macroscopic, scale, such that surface tension, viscous energy dissipation and fluidic resistance may become dominant characteristics of the fluid flow. The Reynolds number, which compares the effects of fluid momentum and viscosity, may decrease to such an extent that liquid flows become laminar rather than turbulent.

In addition, at the microscale, fluids do not necessarily chaotically mix, due to absence of turbulence, and transport of molecules or small particles between adjacent fluids often takes place through diffusion. As a consequence, certain chemical and physical fluid properties (such as concentration, pH, temperature and shear force) may become deterministic. This makes it possible to obtain more uniform chemical reaction conditions and higher grade products in single and multi-step reactions.

Microfluidic devices generally refer to microfabricated devices, which are used for pumping, sampling, mixing, analyzing and dosing liquids. A microfluidic probe is a device for depositing, retrieving, transporting, delivering, and/or removing liquids, in particular liquids containing chemical and/or biochemical substances. For example, microfluidic probes can be used in the fields of diagnostic medicine, pathology, pharmacology and various branches of analytical chemistry. Microfluidic probes can also be used for performing molecular biology procedures for enzymatic analysis, deoxyribonucleic acid (DNA) analysis and proteomics.

In particular, a concept of microfluidic devices is known, which is referred to as "vertical microfluidic probe head" in the literature, see e.g., "A Vertical Microfluidic Probe", by G. V. Kaigala, R. D. Lovchik, U. Drechsler, and E. Delamarche, Langmuir, 2011, 27 (9), pp 5686-5693. The microfluidic probe head comprises a body, e.g., a silicon substrate, which has an edge surface forming part of the processing surface of the device. Liquid channels or microchannels are formed at an interface between two layers, by grooving the body up to the edge surface and closing it with a lid, which simplifies the fabrication of the head. In particular, such devices may comprise a liquid dispenser(s), designed to dispense liquid via an orifice terminating a first one of the channels, and a liquid aspirator(s) aspirates liquid via another orifice and a second one of the channels.

Such devices allow a hydrodynamic flow confinement (HFC) of the processing liquid to be obtained. In other words, a laminar flow of processing liquid is dispensed from an aperture, which liquid is spatially confined within an environmental liquid (or immersion liquid).

Microfluidic probes (MFPs) are known, which may create and sustain a hydrodynamic flow confinement (HFC) with footprints on the order of 100 µm$^2$. To process a large area with a HFC, the current approach is to scan over the entire area sequentially. Such a sequential processing is time consuming.

There are several scenarios where large areas need be processed while retaining important aspects of the HFC. For example, processing tissue sections for immunohistological analysis (detection protein expression levels) requires processing at the cm-scale. Detecting ("sensing") protein expression profiles, for example, is important for some medical decisions and associated analytics.

Current vertical MFPs cannot sustain a HFC at cm-length scale. More generally, current vertical MFPs are not suited for processing large areas.

SUMMARY

According to a first aspect, one or more embodiments of the present invention are embodied as a vertical microfluidic probe head (also called vertical microfluidic chip). The latter basically comprises a middle layer of material and two outer layers. The middle layer comprises two opposite, main surfaces, which are, each, grooved up to a same edge surface that adjoins each of the main surfaces, so as to form two sets of n microchannel cavities, n≥1, on each of the opposite main surfaces. The middle layer is furthermore arranged between the two outer layers, which (at least partly) close the microchannel cavities grooved on the two main surfaces. This way, two sets of n microchannels are formed, which are, each, open on the edge surface, such that two opposite sets of n orifices are formed on the edge surface.

In other words, the channels (or channel portions) are now formed at two opposite interfaces on either side of the middle layer (e.g., a silicon wafer), and are closed by two outer layers (or lids), instead of being formed at a single interface, as in the prior art vertical MFPs. Accordingly, the liquid flows are rotated, compared with prior approaches, and the length of the apertures or of the total footprint of the apertures of either set is not limited by the thickness of the middle layer, as was the case with prior art vertical MFPs. The length is measured on the edge surface and parallel to the main surfaces. Thus, opposite apertures (or set of apertures) can be fabricated, which have a large footprint. In particular, the present approach makes it possible to design cm-scale surface processing device, while still enabling HFC(s).

Two classes of embodiment are notably contemplated. A first class of one or more embodiments is one where the two opposite, main surfaces of the middle layer are, each, multiply grooved up to the edge surface (i.e., n≥2), such that two opposite sets of multiple orifices are formed on the edge surface.

Each set of orifices can have a large footprint, irrespective of the thickness of the middle layer (the middle layer only need be thick enough to enable grooving channel cavities thereon and provide mechanical stability). Each of the opposite sets of orifices has a footprint on the edge surface, which may substantially form an elongated rectangle. The length of such a rectangle (as measured on the edge surface and parallel to each of the main surfaces of the middle layer), may for instance be larger than or equal to 1 mm, or even reach the cm-scale.

Each orifice of a first one of the sets of n orifices may be vis-à-vis (i.e., face to face in relation to) an orifice of a second one of the sets of n orifices, to enable multiple parallel flows of processing liquid and, if necessary, liquid re-aspiration at an orifice opposite to the orifice.

In one or more embodiments, the spacing between an orifice of one set and a closest orifice of the opposite set is between 50 and 1000 µm, e.g., of 100 µm. The spacing is the distance, which, as measured on the edge surface, separates closest edges of two opposite orifices (of distinct sets of orifices). Each aperture may substantially form a square.

In variants, the two opposite, main surfaces of the middle layer are, each, grooved so as for each of the orifices to have an aspect ratio. This way, a first orifice of the first set and a second orifice of the second, opposite set may, each, form a slit. This is especially advantageous where the sets of orifices comprise only one aperture each, according to a second class of one or more embodiments. In this case, each slit can be made large, to enable a fast surface processing.

The first orifice and the second orifice may have respective lengths (again measured on the edge surface and parallel to each of the main surfaces), which substantially differ. This makes it possible for a HFC to better interact with the processed surface and prevents loss of contact between the HFC and the processed surface, as explained later in detail.

A smallest one of the lengths may for instance be at least equal to 50 µm or, even, at least equal to 1 cm.

In one or more embodiments, the first orifice and the second orifice have respective lengths which differ by a factor between 3.0 and 5.0, and preferably by a factor equal to 4.0.

In each of the two classes of one or more embodiments noted above, the orifices of either set may have respective widths (measured on the edge surface and perpendicular to each of the main surfaces) that, each, between 10 µm and 500 µm, and preferably between 20 µm and 200 µm.

The orifices of each set may have essentially a same width, to ease the fabrication process and the parametrization of the HFC.

In one or more embodiments, the middle layer is a wafer or a portion of wafer, so as to leverage know-how in respect of wafer processing. In particular, a silicon wafer of a portion of silicon wafer may advantageously be used.

Each of the outer layers may be a glass layer bonded onto the wafer or portion of wafer.

The above microfluidic probe heads may be used in a vertical microfluidic probe (also according to the invention), where the latter further comprises: a liquid dispenser configured to dispense liquid via the orifices of the first one of the sets of n orifices; and liquid asperators configured to aspirate liquid via orifices of the second one of the sets of n orifices.

In one or more embodiments, the orifices of the two opposite sets of n orifices, the liquid dispenser and the liquid asperators are jointly designed to make it possible for orifices of the second one of the sets of n orifices to aspirate liquid dispensed through orifices of the first one of the sets of n orifices, in operation. As noted earlier, HFC(s) may be relied upon.

According to another aspect, the invention is embodied as a method for processing a surface with a vertical microfluidic probe head such as described above. The method comprises: positioning the microfluidic probe head so as for the edge surface to face a surface to be processed; dispensing processing liquid via each orifice of the first one of the sets of n orifices, so as for the dispensed liquid to process the surface; and aspirating liquid via each orifice of the second one of the sets of n orifices.

In one or more embodiments, aspirating liquid comprises aspirating, via an orifice of the second one of the sets of n orifices, at least some of the processing liquid dispensed through an orifice of the first one of the sets of n orifices.

The surface processing may be done in an environmental liquid. In other words, an immersion liquid is provided on the surface to be processed, and the microfluidic probe head is positioned so as to subsequently dispense processing liquid within the immersion liquid, to process the surface.

In one or more embodiments, the two opposite, main surfaces of the chip are, each, multiply grooved up to the edge surface (n≥2), and the processing liquid is dispensed so as to form laminar flows of processing liquid from each orifice of the first set of orifices.

The microfluidic probe head may notably be moved opposite to the surface to be processed while dispensing processing liquid, to process large surface areas. Advantageously, the microfluidic probe head is moved along a direction forming an angle with respect to an average direction of flows of dispensed processing liquid, wherein the angle is between 30 and 60°. Diagonal movements allow more uniform patterns to be achieved on the processed surface.

Of particular advantage is to provide a vertical microfluidic probe head with one or more external aspiration orifices on the edge surface on either side of the two opposite sets of n orifices. The additional aspiration orifices may be aligned in parallel with a direction of extension of orifices of either set of orifices (i.e., parallel to each of the main surfaces of the middle layer). This way, liquid can be aspired via the one or more external aspiration orifices while dispensing processing liquid and aspirating liquid, which allows the processing liquid flows to be stabilized, as explained in detail below.

Devices, systems and methods embodying the present invention will now be described, by way of non-limiting examples, and in reference to the accompanying drawings.

BRIEF DESCRIPTION OF SEVERAL VIEWS OF THE DRAWINGS

FIG. 3 illustrates a first class of one or more embodiments. In FIG. 3, the two opposite, main surfaces of the head are, each, multiply grooved up to an edge surface of the head, so as to form two sets of four microchannels. The microchannels are, each, open on the edge surface, thereby forming two opposite sets of four orifices.

In FIG. 4, the two opposite, main surfaces of the head are, each, grooved so as for the orifices to have an aspect ratio, thereby forming two opposite (long) slits, according to a second class of one or more embodiments;

FIGS. 8 and 9 show devices in operation, where liquid is dispensed from a row of apertures and aspirated via apertures of the opposite row. In FIG. 9, additional aspiration apertures (not shown) are provided on either (lateral) sides of the two rows of the depicted apertures, like in FIG. 7, to stabilize the parallel flows of processing liquid;

FIG. 10A shows the processing surfaces of the probe head, wherein two opposite (long) slits are visible, whereas FIGS. 10B and 10C respectively show a front side (including an injection channel) and a back side (aspiration channel) of the same probe head as shown in FIG. 10A.

Figures 1, 2:
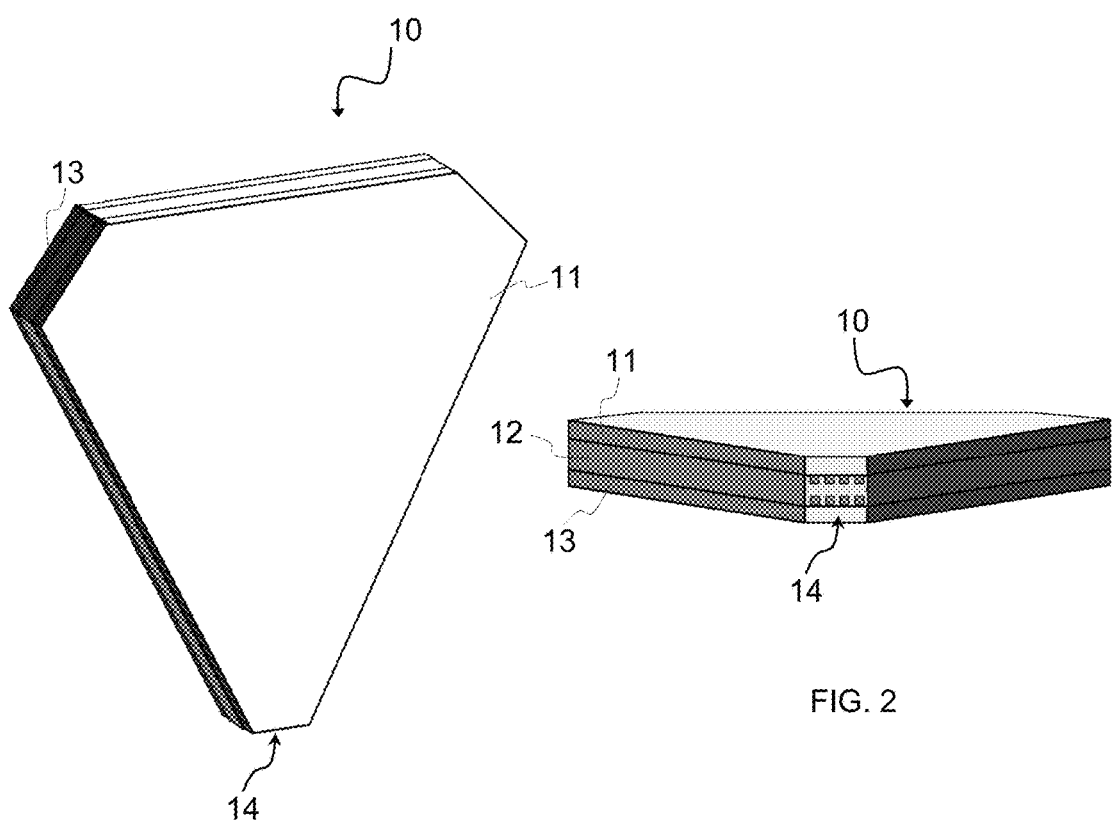
FIGS. 1 and 2 show 3D views of a simplified representation of a vertical microfluidic probe head, according to one or more embodiments.

The accompanying drawings show simplified representations of devices or parts thereof, as involved in one or more embodiments. Technical features depicted in the drawings are not necessarily to scale. Similar or functionally similar elements in the figures have been allocated the same numeral references, unless otherwise indicated.

DETAILED DESCRIPTION

One or more embodiments of the present invention are directed to vertical MFPs suited for large surface processing.

Microchannels and orifices of vertical MFPs are, in the prior art, formed at an interface between two layers, i.e., a body (e.g., a Si wafer) and a lid. The length of the apertures corresponds to the depth of the channels grooved in the body of the MFP head. The length accordingly extends transversely to the main surfaces of the body. The width of an aperture is parallel to the main surfaces of the body.

Thus, and as it may be realized, scaling up the surface processing capability of the prior art, vertical MFPs is a priori difficult. On the one hand, the length of the apertures can hardly be increased, as the maximal length of the apertures is determined by the depth of microchannels, which is necessarily limited by the thickness of the body on which the microchannels are grooved. For instance, in current vertical MFP heads, the injection and aspiration channels are etched on a same face of a Si wafer. The lengths of the apertures is thus determined by the depth of the corresponding channels which is in turn limited by the thickness of the substrate (typically 300 μm, if a Si wafer is used). Long apertures (e.g., on the order of the mm- or cm-scale) can therefore not be obtained with the current fabrication processes.

On the other hand, and as discovered by the present disclosure, scaling up the width of the apertures results in tremendous waste of reagents because only a small fraction of the dispensed liquid interacts with the surface. As they concluded, it is therefore necessary to maintain a reasonable width of the aperture (e.g., in the micrometer length-scale). They have therefore devised a new fabrication concept for vertical MFP heads, which allows large slits (or rows of multiple apertures) to be obtained.

Referring generally to FIGS. 1-11, an aspect of the invention is first described, which concerns a vertical microfluidic probe head 10, 10a. The latter basically comprises a middle layer 12 of material and two outer layers 11, 13. I.e., two lids are now used, instead of one, and microchannels are grooved on either side of the middle layer 12.

Namely, the middle layer 12 comprises two opposite, main surfaces 12ms (see e.g., FIGS. 1-4), which are, each, grooved up to a same edge surface 12es, so as to form two sets of n microchannel cavities 15, 16, n≥1, on each of the two main surfaces 12ms.

The middle layer 12 may be a wafer or a portion of wafer. It may for instance comprise (or consist of) a silicon waver of a portion of silicon wafer, if necessary chemically/mechanically processed, as known per se. The outer layers 11, 13 may be glass layers bonded, e.g., by anodic bonding, onto the layer 12.

The edge surface 12es will form part of the processing surface 14 of the device. It adjoins each of the main surfaces 12ms (via an edge thereof). The edge surfaces 11es, 13es (FIGS. 3-6) of the outer layers may be level with the edge surface 12es of the middle layer 12, so as to define a clean, flat processing surface 14 for the chip 10, 10a. In variants, they may exhibit a slight offset, which may be desired to shape or constrain the liquid flow dispensed. The edge surfaces 11-13es define, altogether the processing surface 14 visible in FIG. 2. The edge surfaces 11es, 12es, 13es may be perpendicular to the main surfaces of the head, or not, depending on how the layers 11-13 are cut or cleaved and the properties of the corresponding materials.

As explained below in detail, two classes of one or more embodiments can notably be contemplated. In the first class (FIGS. 2, 3, 5 and 7-9), two sets of n microchannel cavities 15, 16, n≥1, are formed on either side of the middle layer 12. In the second class of one or more embodiments (FIGS. 4, 6), two (long) slits are formed at each interface.

Figure 3:
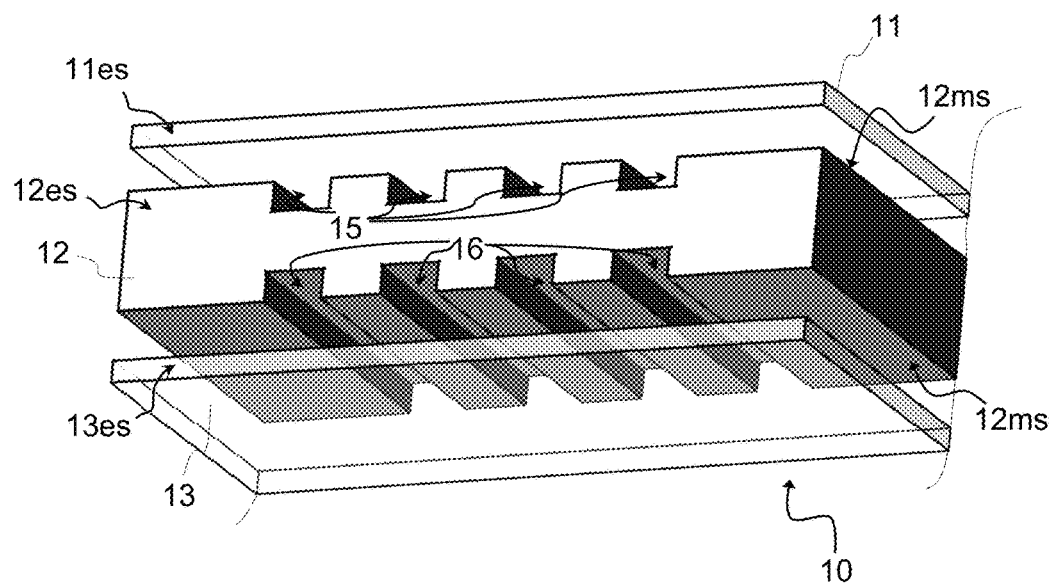
FIGS. 3 and 4 show 3D (exploded) views of simplified representations of distal portions of vertical microfluidic probe heads, which portions encompass the processing surfaces of the heads, according to distinct classes of one or more embodiments. Namely.

In all cases, the middle layer 12 is arranged, e.g., sandwiched between the two outer layers 11, 13. The middle layer may be between and in contact (possibly everywhere) with an inner surface of each of the two outer layers. In variants, intermediate layers or layer portions may be involved, e.g., due to fabrication constraints. The outer layers 11, 13 at least partly close the microchannel cavities 15, 16 grooved on the two main surfaces 12ms of the layer 12, so as to form two sets of n microchannels. Here, "grooved" means that the middle layer 12 is physically and/or chemically processed so as to form grooves, i.e., cuts or depressions on each side of the layer 12. Thus, the microchannel cavities 15, 16 are grooves. The latter may have portions of constant cross-sectional dimensions, as illustrated in FIGS. 3. Each of the outer layers 11, 13 is against a respective one of the main surfaces 12ms of the middle layer 12, thereby at least partly closing the microchannel cavities 15, 16 grooved thereon. Residual portions of these cavities 15, 16 may not be closed by the outer layers 11, 13, e.g., for the purpose of providing tubing ports or other elements directly on-chip, as known per se.

The microchannels are, each, open on the edge surface 12es. As a result, two opposite sets of n orifices 17, 18, or apertures, are formed on the edge surface 12es, which allows to dispense and aspirate liquid and, if necessary, to form an HFC. The terms "aperture" and "orifice" are used herein are synonymous.

Figure 5:
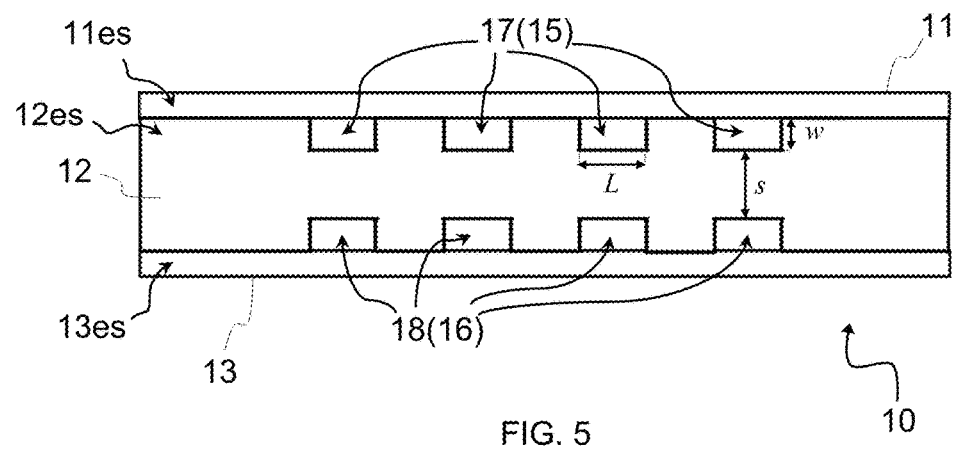
FIGS. 5 and 6 are 2D, cross-sectional views of the processing surface of the devices shown in FIGS. 3 and 4, respectively.
Figure 6:
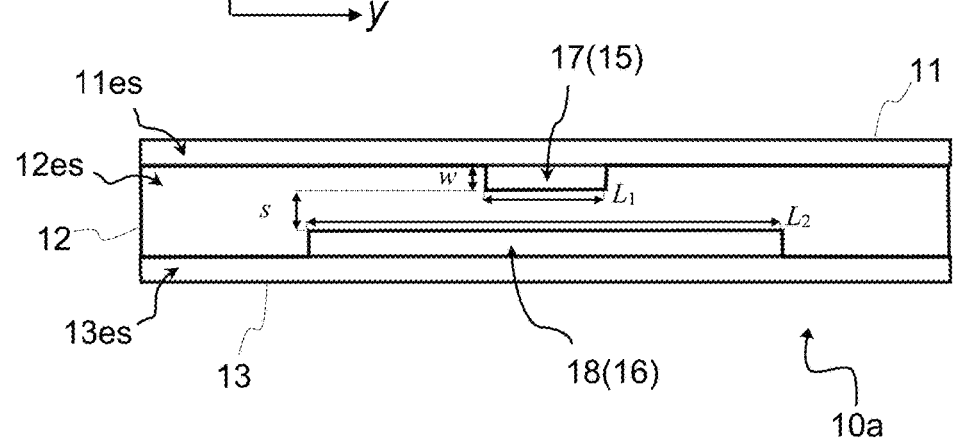

Relevant geometrical parameters of vertical MFPs are the following. As illustrated in FIGS. 5 and 6, the width w of an aperture corresponds to the dimension of the apertures, transversely to the main surfaces of the middle layer 12. The width w typically extends parallel to the direction of the liquid flow (from one aperture to another, opposite aperture). The length L (or $L_1$ and $L_2$) of the apertures corresponds to the dimension of apertures in a direction parallel to the main surfaces (and typically perpendicular to the liquid flows). The aperture spacing s is the distance separating injection and aspiration apertures (i.e., the distance between two closest edges of the apertures). The widths w, the lengths L and the spacing s are, each, measured on the processing surface of the head, i.e., the edge (or end) surface of the head that faces a surface to be processed, in operation.

In the present approach, the channels (or channel portions) 15, 16 are formed at two interfaces, i.e., between the middle layer 12 and the two outer layers 11, 13 (lids), instead of being formed at a single interface, as in prior vertical MFPs. Thus, the length of the apertures is not anymore limited by the thickness of the middle layer, as was the case with prior vertical MFPs. Accordingly, opposite apertures (or set of apertures) can be fabricated that have a large footprint. As a result, it is possible to simply fabricate large scale surface processing devices, while still enabling HFC.

Owing to the present approach, this is the spacing between opposite orifices 17, 18 that is now constrained by the thickness of the middle layer 12. In fact, the spacing between opposite orifices 17, 18 depends on both the thickness of the layer 12 and the desired depth of the channels 15, 16. Thus, if the thickness of the middle layer 12 is imposed (as when using a standard Si wafer), the deeper the channel, the smaller the spacing. Still, one will generally try to obtain a spacing that is between 50 and 1000 µm, in order to maintain suitable properties for the liquid dispensed. Meanwhile, the footprint of the rows of apertures (or the lengths of the opposite slits) can be scaled up to optimize the geometry for large scale surface processing. Each set of orifices can have a long footprint, irrespective of the thickness of the middle layer 12. The latter only need be thick enough to groove channel cavities and provide mechanical stability.

Other materials than silicon, for example plastics, elastomers, ceramics, glass, metals can be contemplated for the middle layer 12, so that the spacing between apertures 17, 18 is not necessarily constrained. Thus, most generally, the spacing between injection and aspiration apertures may be between 0.5 µm and 10 mm, and preferably between 1.0 µm and 2.0 mm, in order to obtain stable liquid flows. The spacing depends in fact on a number of parameters, which may need to be jointly optimized, such parameters including notably: the desired liquid flow characteristics, the depth of the channels (which determines the apertures' width, or diameter, see below) and the desired mechanical properties for the middle layer.

Figure 7:
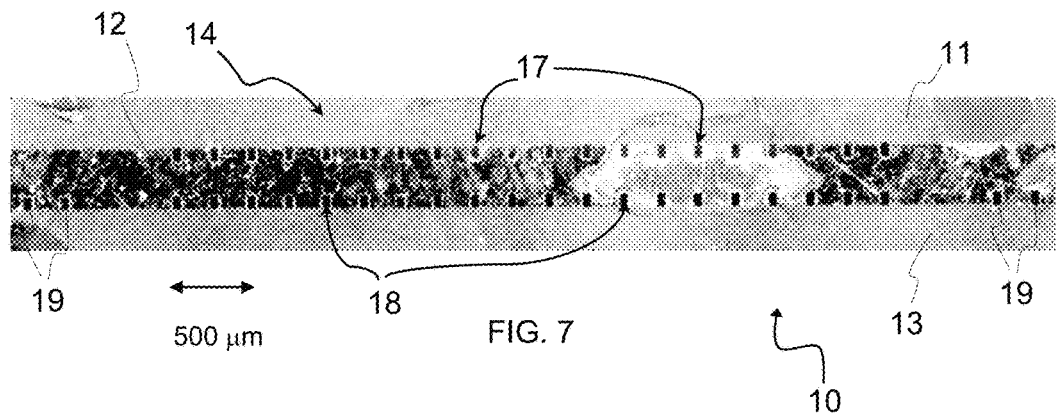
FIGS. 7, 8 and 9 are photographs of the apex of probe heads according to the first class of one or more embodiments.
Figure 8:
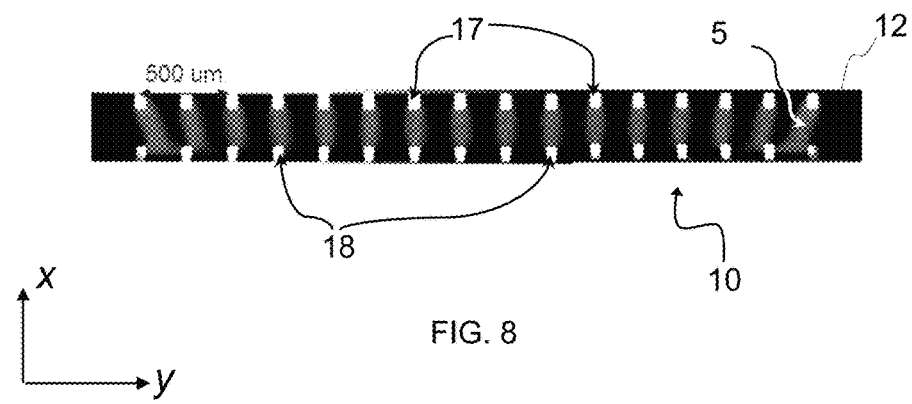
Figure 9:
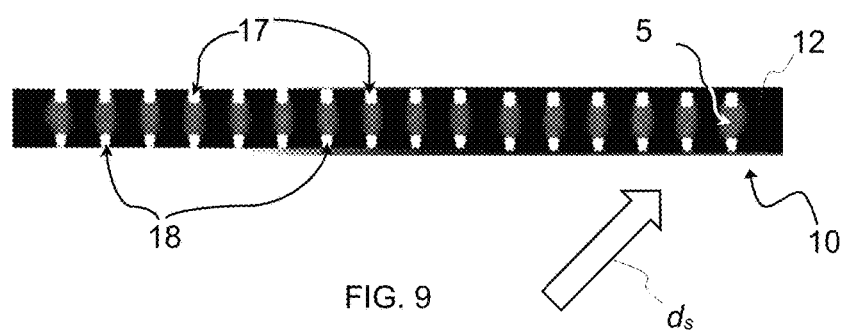

For instance, as depicted in FIG. 3, each of the opposite sets of orifices 17, 18 has a footprint on the edge surface 12es, which footprint typically forms a rectangle. The length of this rectangle, as measured on the edge surface 12es and parallel to each of the main surfaces 12ms, may be larger than or equal to 1 mm, or even reach the cm-scale, as illustrated in FIGS. 7-9. The same considerations apply to slits (FIG. 4), whose lengths can reach the mm- or cm-scale, as in the embodiment of FIGS. 10A-10C.

As noted earlier, the orifices 17, 18 may have all the same width, which simplifies not only the fabrication process but also the parametrization of the injection and aspiration flow rates. As defined earlier, the width is measured on the edge surface 12es, perpendicularly to the main surfaces 12ms, for the sake of consistency when comparing the geometry of present apertures 17, 18 to the geometry of apertures of prior art devices. For the same reasons, the lengths of the apertures are measured on the edge surface 12es, but parallel to each of the main surfaces 12ms. The orifices 17, 18 may for instance have a width between 20 µm and 200 µm, for example of 50 µm, especially if a standard Si wafer is used for the layer 12, which constrains the apertures' widths and spacing. However, other materials may be used for the layer 12, such that the average width of the apertures may, more generally, be between 0.5 and 1000 µm.

In some specific embodiments, the ejection aperture 17 may, however, be designed small enough to enable a liquid confinement having a small diameter, e.g., of about 150 µm. Such a confinement is best obtained using apertures 17 having an average "diameter" of about 20 to 50 µm (the "diameter" is approximately equal to the width and length of an aperture, when using a design such as depicted in FIGS. 3 and 5). The apertures 17, 18 end, each, a respective conduit (i.e., the respective channels 15, 16), which may have the same (cross-sectional) dimensions as their respective apertures. Using a spacing less than 2 mm, a stable HFC can in principle be achieved, provided that suitable flow rates are used. In this respect, the injection flow rate $Q_i$ may typically be chosen to be 1.0 pL/s-0.1 mL/s, and preferably 1.0-50 nL/s, while the aspiration flow rate $Q_a$ is typically chosen to be 1.2 pL/s-1 mL/s, and preferably 2.0-200 nL/s. A suitable ratio $Q_i:Q_a$ is set to 1:3, see below.

In the first class of one or more embodiments (FIGS. 2, 3, 5, 7-9), the main surfaces 12ms are, each, multiply grooved up to the edge surface 12es, such that n≥2. In this case, multiple small apertures 17, 18 are defined at each interface 12-13 and 11-12, to form two parallel rows of apertures. Thus, the liquid dispensed and the effective area processed can be scaled up. As it can further be realized, having two parallel rows of apertures allows to maintain symmetric apertures (i.e., apertures forming a square or a rectangle), which, in turn, allows to obtain parallel liquid flows. Even, parallel HFCs can easily be obtained, which interact well with the surface. I.e., parallel rows of apertures circumvent the potential issue of loss of contact between the processing liquid and the processed surface, as explained later in detail. Providing parallel liquid flows is thus a simple way of scaling the processing area capability of the device.

Each orifice 17 of the first set may be arranged vis-à-vis (i.e., face to face in relation to) an orifice 18 of a second one of the sets of n orifices. Thus, a head with a symmetric array of apertures is obtained in that case. The array may scan the surface in diagonal in order to obtain a more uniform pattern on the processed surface. In variants, the orifices may be shifted, so as to create slanted liquid trails, and the head moved perpendicularly to its main surfaces, above the surface 2 to be processed, resulting in the same effect. A symmetric array such as depicted in FIG. 3 is, however, simpler to handle.

The second class of one or more embodiments is now described in detail, in reference to FIGS. 4, 6, 10, and 11. At present the two opposite, main surfaces 12ms of the middle layer 12 are, each, grooved so as for each of the resulting orifices 17, 18 to have an aspect ratio, thereby forming (long) slits. A first slit 17 is obtained at the upper interface 11-12 and a second slit 18 is defined at the interface 12-13, opposite to the first one 17 on the surface 12es. Two opposite slits are already sufficient for the present purpose, as assumed in the one or more embodiments depicted in the accompanying drawings. Yet, variants can be contemplated where the processing surface 14 exhibits multiple opposite slits. In addition, aspect of the first and second classes of one or more embodiments may be combined, e.g., so as to intermingle long slits and short (square) apertures, if needed.

However, and as realized by the present disclosure, the use of slits of equal lengths may, under certain circumstances, lead to a loss of contact between the liquid flow dispensed (e.g., a HFC) and the surface. I.e., long slit apertures may cause the HFC to not interact well with the surface.

This problem is tentatively explained as follows. When using devices according to the first class of one or more embodiments (e.g., opposite sets of square apertures), the liquid flow of liquid aspirated into the aspiration apertures comes from all four sides of the aspiration aperture. Loosely stated, processing liquid is essentially aspirated from the side of the aspiration aperture 18 that is the closest to the injection aperture 17 while essentially immersion liquid gets aspirated from the three other sides. By defining a flow rate ratio of $Q_i:Q_a$ as, e.g., 1:3 (where $Q_a$ denotes the aspiration flow rate and $Q_i$ the injection flow rate), a flow confinement of the processing liquid can be obtained. However, in the case of slit apertures, the length of the slits is (much) larger than the width, and the aspirated immersion liquid may not be sufficient to accommodate the flow rate difference ($Q_a - Q_i$). As the injection flow rate $Q_i$ of the processing liquid is typically set smaller than the aspiration flow rate $Q_a$ ($Q_a < Q_i$), the aspiration aperture need aspirate additional immersion liquid, coming from the side facing the injection aperture 17. For this to happen, a sheath of immersion liquid forms below the processing liquid flow, resulting in loss of contact between the HFC and the surface.

Figure 4:
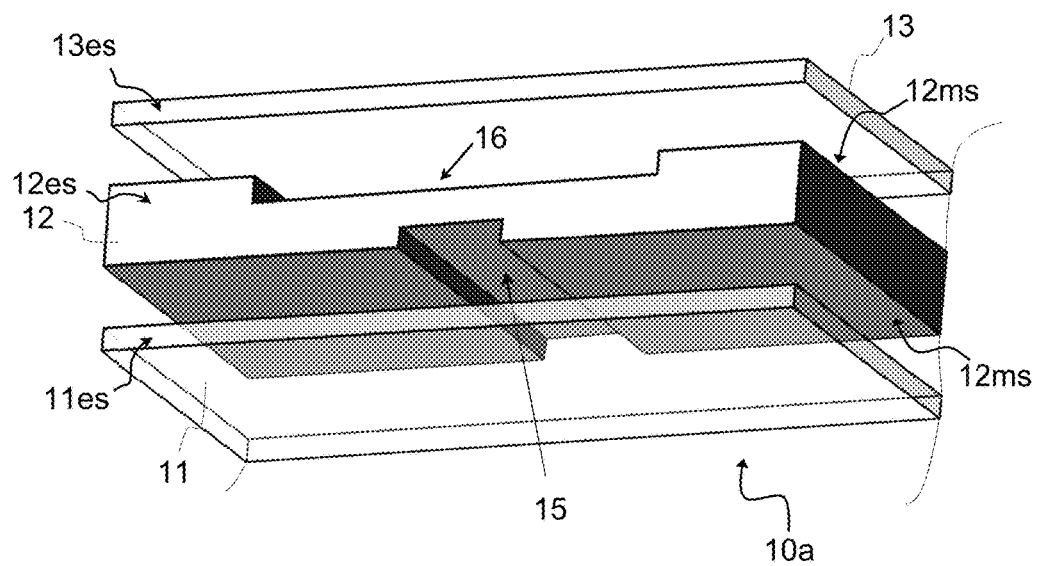
Figure 10A:
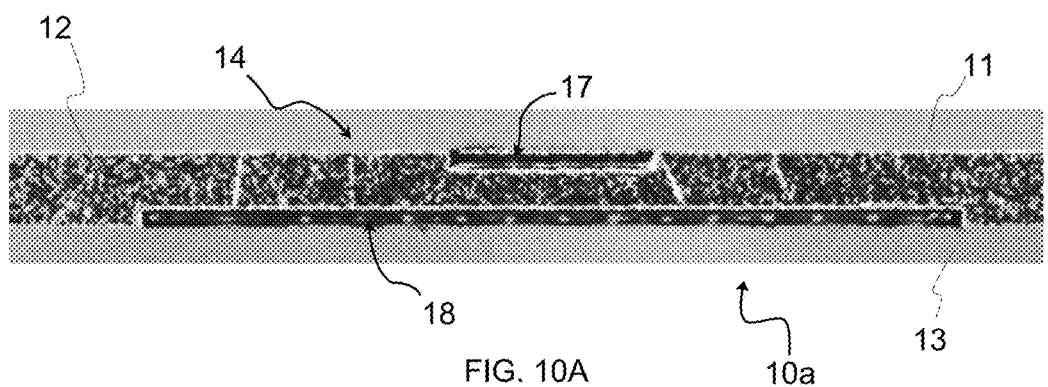
FIGS. 10A, 10B and 10C are magnified photos of a probe head according to the second class of one or more embodiments.

A solution to this problem is to differentiate the lengths of the slits 17, 18. Thus, as illustrated in FIGS. 4, 6 and 10, the first slit 17 and the second slit 18 may have respective lengths $L_1$ and $L_2$ that substantially differ, to compensate for excess aspiration of immersion liquid. In practice, satisfactory results are obtained for lengths that differ by a factor between 3.0 and 5.0, e.g., by a factor of 4, as assumed in FIGS. 4, 6 and 10. The smallest length may for instance be at least equal to 50 μm. In FIG. 10A this length is 1 mm. The longest slit may accordingly be between 150 μm and 5 cm, and preferably 4 mm, as in FIG. 10A. However, owing to the remarkable scaling properties of the present devices, the smallest slit may reach 1 cm, or more.

The two classes of one or more embodiments as discussed above are now compared. A probe head such as depicted in FIGS. 2, 3 and 5 has multiple advantages. It may be used to process large surface areas and prevents, by design, loss of contact between the processing liquid flows and the processed surface. However, multiple apertures have (minor) technical disadvantages compared to large slits, inasmuch as clogging of particles is more likely to happen in small apertures. Also, because all injection (or aspiration) channels may be fed by a common injection (or aspiration) stem, it is more difficult to remove bubbles blocked in one of the channels, compared to a solution using large slits.

Figure 11:
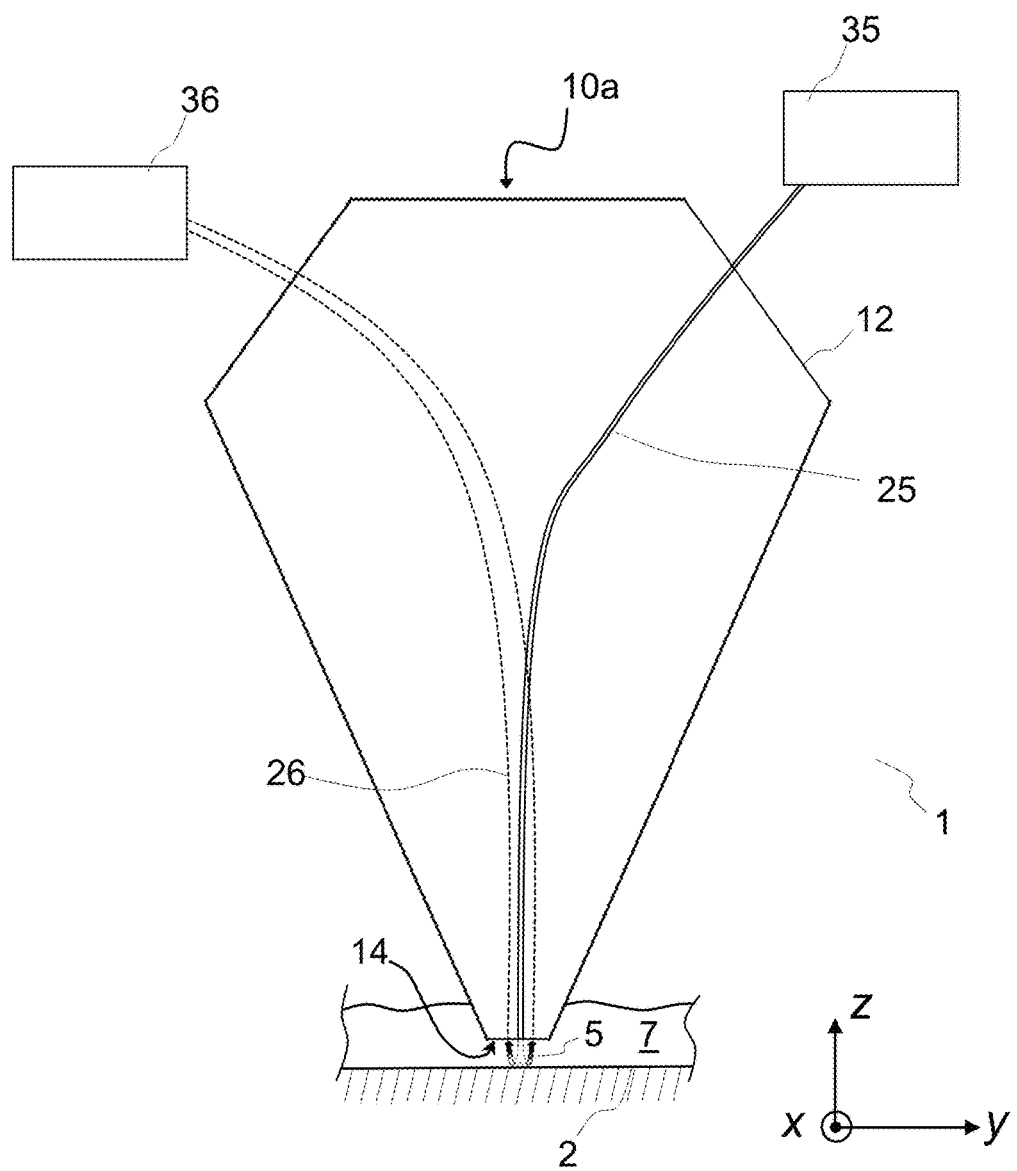
FIG. 11 is a 2D view of a simplified representation of microfluidic probe, in operation, and according to one or more embodiments.

Referring now to FIG. 11, the present invention can also be embodied as a vertical microfluidic probe 1, i.e., a microfluidic device comprising a probe head 10, 10a as described above, as well as other components to dispense and aspirate liquids, to process a surface. Namely, the probe 1 further comprises liquid dispensers 25, 35 (e.g., including a liquid reservoir 35, pumps/pressure means [not shown for clarity] and channels 35), generally configured to dispense processing liquid 5 via orifices 17 of a first one of the sets of n orifices. Similarly, liquid asperators 26, 36 are present (which comprise, e.g., a liquid reservoir 36, pumps/pressure means [not shown] and channels 36), which are configured to aspirate liquid via orifices 18 of the second one of the sets of n orifices.

The orifices 17, 18, the liquid dispensers 25, 35 and the liquid asperators 26, 36 may be jointly designed for the system to be able to aspirate, via orifices 18, liquid dispensed through opposite orifices 17, in operation. I.e., orifices may be dimensioned and positioned at a distance so as to make it possible for the probe to aspirate at apertures 18 processing liquid delivered through the apertures 17, for a given ratio of flow rates. This way, a HFC, or multiple parallel HFCs can be achieved.

Figure 10B:
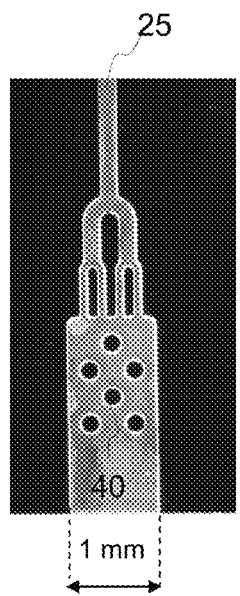
Figure 10C:
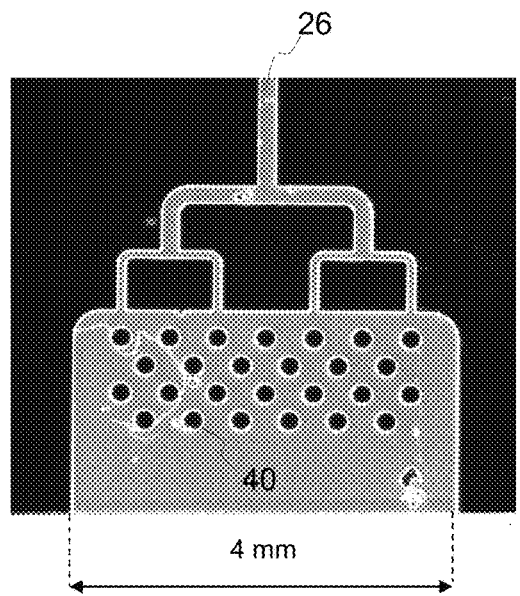

As illustrated in FIGS. 10B, 10C and 11, the injection (or aspiration) channels 25, 26 may be fed by a common injection (or aspiration) stem, in fluid communication with a respective liquid reservoir 35, 36. Pressure sources (not shown) are provided to apply a pressure in each channel 25, 26, together with pressure control means, if necessary. The latter may be operatively coupled to the sources to controllably switch a flow direction of liquid, if needed. Other elements, such as valves, hydrodynamic flow resistors, etc., may be present, as usual in MFPs. The channels 25, 35 may have a tree structure, as depicted in FIGS. 10B and 10C, so as to distribute the liquid flow in a tree network for maintaining equivalent flow resistance, and include pillars 40 to maintain constant height and prevent the cover layers 11, 13 to collapse.

Various changes to the above one or more embodiments may be made and equivalents may be substituted without departing from the scope of the present invention.

For example, dual aspiration slit aperture designs can be contemplated, where two middle layers are present (not shown). For instance, a first Si wafer may be grooved on each side, to provide both an injection and a first aspiration channel. The first Si wafer is sandwiched between a second Si wafer (closing the injection channel) and a glass panel (closing the first aspiration channel). The second Si wafer may itself be grooved, oppositely to the injection channel of the first Si wafer, to provide a second aspiration channel, which can be closed by a second glass layer. Providing additional "middle" layers allows to effectively increase the aspiration volume, so that the aspiration slits and the injection slit may not necessarily need to differ in length in that case. The fabrication is, however, more challenging, and this design requires an additional silicon layer. Furthermore, the injection channel is not be visible (from the main surfaces) because it is hidden by the second silicon wafer.

While standard Si wafer are typically 300 μm thick, one may want to use thicker materials for the middle layer 12, in order to obtain larger aperture spacings and/or larger widths. Indeed, and as concluded by the present disclosure based on various analytical studies performed based on the teachings herein, the time to scan a large surface and the reagent usage are directly linked to the aperture spacing. Thus, using a larger aperture spacing will result in faster scans and consume less reagents. However, a larger aperture spacing makes it more difficult to confine the liquid flow.

The fabrication of present MFP heads and MFPs is straightforward. The same fabrication techniques as used in known vertical MFP heads can be used in the present context. The main difference is that the layer 12 need be processed and bonded on each of its two main surfaces, instead of one of these surfaces. All structured elements, like microchannels, or parts and/or devices integrated in the layer 12 may be manufactured on-chip (using standard lithography processes, for example).

Referring now to FIGS. 8, 9 and 11, the present invention may, according to another aspect, be embodied as a method for processing a surface 2. Such a method relies on a vertical microfluidic probe head 10, 10a or a probe 1 as described earlier. Most basically, and as illustrated in FIGS. 8, 9 and 11, the method relies on first positioning the microfluidic probe head 10, 10a so as for its edge surface 12es to face the surface 2 to be processed, in the plane (x, y). Then, processing liquid 5 is dispensed via each orifice 17 of the first one of the sets of n orifices, so as for the dispensed liquid 5 to process surface 2, while liquid 5, 7 gets aspirated via each orifice 18 of the second one of the sets of n orifices.

As specifically seen in FIGS. 8, 9, the probe head 10a can be dimensioned and, more generally, the probe 1 may be designed, such that liquid aspirated at the orifice(s) 18 comprises at least some of the processing liquid dispensed through opposite orifice(s) 17. In that respect, the head may be operated in an immersion liquid 7, provided on the surface 2 to be processed, as illustrated in FIG. 11. The probe head 10, 10a is positioned above the surface 2, so as to subsequently dispense processing liquid 5 within the immersion liquid 7, as known per se, except that, in the present case, processing liquid is dispensed via multiple orifices 17 or a large slit 17.

The flow rates may be adjusted so as to reach a laminar flow of dispensed liquid 5, which in turn enables a HFC. This is more easily achieved with devices according to the first class of one or more embodiments, comprising two rows of multiple apertures 17, 18 (n≥2) as, in this case, multiple, parallel laminar flows of processing liquid 5 are formed. To that aim, orifices need be suitably spaced, in each row of apertures. In the schematical representation of FIG. 5, a minimal spacing is assumed, in each row, where the horizontal gap between each aperture is approximately equal to the length of the apertures. However, larger gaps may be contemplated (100 μm to 1 mm) in real devices, as assumed in FIGS. 7-9, to avoid turbulences due to interactions between parallel liquid flows. The gaps are also optimized according to the desired properties for the liquid flows.

As noted earlier, the method may further comprise moving the microfluidic probe head 10, 10a opposite to the surface 2 to be processed while dispensing processing liquid, to process a large surface area.

The head may for instance be moved diagonally, i.e., along a direction $d_s$ forming an angle with respect to an average direction of liquid flows, wherein the angle is typically between 30 and 60°, e.g., of 45°, as assumed in FIG. 9. This is specifically desired when using a device such as depicted in FIG. 2 or 3, with two parallel rows of apertures 17, 18, so as to allow more homogeneous patterns to be obtained in fine. In variants, apertures 17, 18 in opposite sets may be out-of-phase, i.e., shifted, in which case the surface may be processed by scanning it along a direction (x) parallel to the liquid flows.

Present vertical MFPs, MFP heads and methods preserve key advantages of known MFP techniques and can be embodied as non-contact devices and techniques, where the probe head does not contact the surface to be processed. A typical working distance between the apex of the MFP head and the surface is 10-50 um. However, it can work using a spacing that is between 5 μm and 200 μm. The liquid environment (or immersion liquid) is typically an aqueous environment.

Using a probe head 10 as depicted in FIG. 2, 3 or 5 has many advantages, as noted earlier. However, and as the present disclosure realizes too, the HFCs sustained by the outermost pairs of apertures 17, 18 tend to be attracted towards the center, resulting in a distortion of the outermost HFCs. One consequence of this is that during scanning, the residence time will not be uniform over the entire surface scanned. In order to mitigate this problem, aspiration channels can be added at the external (lateral) sides of the array. The aspiration force attracting the HFC towards the centers can therefore be compensated. Accordingly, a vertical microfluidic probe head 10 as discussed above may further advantageously comprise one or more external aspiration orifices 19, provided on the edge surface 12es, on either side of the opposite sets of n orifices 17, 18, as illustrated in FIG. 7. The aspiration orifices 19 are typically aligned parallel with the main surfaces 12ms. Thus, liquid (which essentially is immersion liquid) can be aspirated via the external aspiration orifices 19 while dispensing processing liquid 5 and aspirating liquid 5, 7. This, in turn, allows liquid flows between injection orifices 17 and aspiration orifices 18 to be stabilized, as illustrated in FIGS. 8 and 9.

In detail, FIGS. 8 and 9 depicts real flow confinements of rhodamine, obtained with a head such as depicted in FIG. 7. FIG. 8 shows liquid flows as experimentally observed, while the external aspiration orifices (not shown) are disabled. As seen in FIG. 8, the HFCs bends toward the center. FIG. 9 shows similar liquid flows as obtained when external orifices (not shown in FIG. 9) are enabled and liquid is aspirated via the external orifices 19, while dispensing processing liquid. As seen in FIG. 9, the HFCs are now stabilized.

The external aspiration orifices 19 may be at the level of, i.e., aligned with the aspiration orifices 18, to most efficiently deflect the inwardly bent liquid flows. The appropriate aspiration flow rates (for channels 19) can be refined, e.g., by trial and error, based on other relevant experimental parameters (geometry of orifices, aspiration and injection flow rates $Q_a$ and $Q_i$, etc.).

While the present invention has been described with reference to a limited number of embodiments, variants and the accompanying drawings, it will be understood by those skilled in the art that various changes may be made and equivalents may be substituted without departing from the scope of the present invention. In particular, a feature (device-like or method-like) recited in a given embodiment, variant or shown in a drawing may be combined with or replace another feature in another embodiment, variant or drawing, without departing from the scope of the present invention. Various combinations of the features described in respect of any of the above embodiments or variants may accordingly be contemplated, that remain within the scope of the appended claims. In addition, many minor modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims. In addition, many other variants than explicitly touched above can be contemplated. In particular, other materials than those explicitly mentioned can be contemplated and the present vertical heads are not necessarily limited to three layers 11-13, i.e., additional "middle" layers 12 may be provided to form additional aspiration orifices or slits.

What is claimed is:

1. A vertical microfluidic probe head comprising:
 a middle layer of material; and
 two outer layers, wherein each of the middle layer and the two outer layers are distinct from each other;
 wherein the middle layer comprises two opposite, main surfaces, a first main surface and a second main surface, which are, each, grooved up to a same edge surface that adjoins each of the main surfaces, so as to form two sets of n microchannel cavities, n≥1, on each of the main surfaces wherein a first set of the n microchannel cavities on the first main surface is not in fluidic communication with a second set of the n microchannel cavities on the second main surface except at the same edge surface; and wherein the middle layer is arranged between the two outer layers, the latter at least partly closing the microchannel cavities grooved on the two main surfaces, so as to form two sets of n microchannels that are, each, open on the edge surface, such that two opposite sets of n orifices are formed on the edge surface.

2. A vertical microfluidic probe head according to claim 1, wherein:

the two main surfaces are, each, multiply grooved up to the edge surface, such that n≥2.

3. A vertical microfluidic probe head according to claim 1, wherein:

each orifice of a first one of the sets of n orifices is face to face in relation to an orifice of a second one of the sets of n orifices.

4. A vertical microfluidic probe head according to claim 2, wherein:

each of the opposite sets of n orifices has a footprint on the edge surface, which footprint substantially forms a rectangle, whose length, as measured on the edge surface and parallel to each of the main surfaces, is larger than or equal to 1 mm.

5. A vertical microfluidic probe head according to claim 1, wherein:

a spacing between an orifice of the first one of the sets of n orifices and a closest orifice of the second one of the sets of n orifices is between 50 and 1000 μm.

6. A vertical microfluidic probe head according to claim 1, wherein:

the two main surfaces are, each, grooved so as for each of the orifices to have an aspect ratio, whereby a first orifice of the first one of the opposite sets and a second orifice of the second one of the opposite sets form, each, a slit.

7. A vertical microfluidic probe head according to claim 6, wherein:

the first orifice and the second orifice have respective lengths, the lengths measured on the edge surface and parallel to each of the main surfaces; and the lengths substantially differ.

8. A vertical microfluidic probe head according to claim 7, wherein:

a smallest one of the lengths is at least equal to 50 μm.

9. A vertical microfluidic probe head according to claim 7, wherein:

a longest one of the lengths is at least equal to 5 cm.

10. A vertical microfluidic probe head according to claim 7, wherein:

the lengths differ by a factor between 3.0 and 5.0.

11. A vertical microfluidic probe head according to claim 7, wherein:

the lengths differ by a factor equal to 4.0.

12. A vertical microfluidic probe head according to claim 1, wherein:

the orifices of the two opposite sets of n orifices have respective widths, wherein the widths are measured on the edge surface and perpendicular to each of the main surfaces, and are, each, between 20 μm and 200 μm.

13. A vertical microfluidic probe head according to claim 12, wherein:

the orifices have an essentially equal width.

14. A vertical microfluidic probe head according to claim 1, wherein:

the middle layer is a wafer or a portion of wafer.

15. A vertical microfluidic probe head according to claim 14, wherein:

the wafer or portion of wafer is a silicon wafer of a portion of silicon wafer.

16. A vertical microfluidic probe head according to claim 15, wherein:

each of the outer layers is a glass layer bonded onto the wafer or portion of wafer.

17. A vertical microfluidic probe, comprising:

a vertical microfluidic probe head according to claim 1;

a liquid dispenser configured to dispense liquid via the orifices of the first one of the sets of n orifices; and a liquid aspirator configured to aspirate liquid via orifices of the second one of the sets of n orifices.

18. The vertical microfluidic probe according to claim 17, wherein:

the orifices of the two opposite sets of n orifices, the liquid dispenser and the liquid aspirator are jointly designed so as for the system to aspirate, via orifices of the second one of the sets of n orifices, liquid dispensed through orifices of the first one of the sets of n orifices, in operation.

* * * * *